United States Patent
Wu et al.

(10) Patent No.: US 10,436,840 B2
(45) Date of Patent: Oct. 8, 2019

(54) BROADCAST SCAN NETWORK

(71) Applicant: NVIDIA Corp., Santa Clara, CA (US)

(72) Inventors: Jau Wu, Los Gatos, CA (US); Saurabh Gupta, Santa Clara, CA (US)

(73) Assignee: NVIDIA Corp., Santa Clara, CA (US)

( * ) Notice: Subject to any disclaimer, the term of this patent is extended or adjusted under 35 U.S.C. 154(b) by 86 days.

(21) Appl. No.: 15/935,438

(22) Filed: Mar. 26, 2018

(65) Prior Publication Data

US 2019/0128963 A1 May 2, 2019

Related U.S. Application Data

(60) Provisional application No. 62/577,641, filed on Oct. 26, 2017.

(51) Int. Cl.
*G01R 31/3185* (2006.01)

(52) U.S. Cl.
CPC ....... *G01R 31/318558* (2013.01); *G01R 31/318536* (2013.01); *G01R 31/318541* (2013.01); *G01R 31/318563* (2013.01); *G01R 31/318597* (2013.01)

(58) Field of Classification Search
CPC .... G01R 31/318597; G01R 31/318536; G01R 31/318541; G01R 31/318558; G01R 31/318563
See application file for complete search history.

(56) References Cited

U.S. PATENT DOCUMENTS

| | | | |
|---|---|---|---|
| 4,710,931 A | 12/1987 | Bellay et al. | |
| 5,077,740 A | 12/1991 | Kanuma | |
| 5,150,044 A | 9/1992 | Hashizume et al. | |
| 5,425,034 A | 6/1995 | Ozaki | |
| 5,448,575 A | 9/1995 | Hashizume | |
| 5,841,791 A | 11/1998 | Hashizume | |
| 6,158,032 A | 12/2000 | Currier et al. | |
| 7,949,916 B1 | 5/2011 | Ang | |
| 7,958,417 B2 * | 6/2011 | Chakraborty | G01R 31/318544 714/726 |
| 8,495,443 B1 | 7/2013 | Yu et al. | |
| 2012/0117436 A1 * | 5/2012 | Portolan | G01R 31/318314 714/738 |

(Continued)

OTHER PUBLICATIONS

IEEE Standard for Access and Control of Instrumentation Embedded within a Semiconductor Device, in IEEE Std 1687-2014, vol., no., pp. 1-283, Dec. 5, 2014 (Year: 2014).*

(Continued)

*Primary Examiner* — Cynthia Britt
(74) *Attorney, Agent, or Firm* — Rowan TELS LLC

(57) ABSTRACT

A distributed test circuit includes partitions arranged in series to form a scan path, each partition including a scan multiplexer, a test data register, and a segment insertion bit component. The scan multiplexer of each partition provides inputs to the corresponding test data register of the each partition. Broadcast control logic generates a select signal to the scan multiplexer of each partition to place the test circuit in a broadcast mode when the select signal is asserted, and to switch the test circuit to a daisy mode when select signal is de-asserted. The segment insertion bit is operable to include or bypass each partition from the scan path.

12 Claims, 10 Drawing Sheets

(56) References Cited

U.S. PATENT DOCUMENTS

| | | | |
|---|---|---|---|
| 2012/0137186 A1* | 5/2012 | Portolan | G01R 31/318533 |
| | | | 714/727 |
| 2013/0173976 A1 | 7/2013 | Tekumalla et al. | |
| 2017/0131355 A1* | 5/2017 | Johnson | G01R 31/318588 |
| 2018/0335475 A1* | 11/2018 | Danialy | G01R 31/31712 |

OTHER PUBLICATIONS

Z. Zhong, G. Li, Q. Yang, J. Qian and K. Chakrabarty, "Broadcast-based minimization of the overall access time for the IEEE 1687 network," 2018 IEEE 36th VLSI Test Symposium (VTS), San Francisco, CA, 2018, pp. 1-6. (Year: 2018).*

Y. Huang and J. Rajski, "Session T1 B: Tutorial: SoC testing," 2015 28th IEEE International System-on-Chip Conference (SOCC), Beijing, 2015, pp. 1-3. (Year: 2015).*

S. S. Nuthakki, R. Karmakar, S. Chattopadhyay and K. Chakrabarty, "Optimization of the IEEE 1687 access network for hybrid access schedules," 2016 IEEE 34th VLSI Test Symposium (VTS), Las Vegas, NV, 2016, pp. 1-6. (Year: 2016).*

* cited by examiner

US 10,436,840 B2

BROADCAST SCAN NETWORK

CROSS REFERENCE TO RELATED APPLICATIONS

This application claims priority and benefit of U.S. Application Ser. No. 62/577,641, filed on 26 Oct. 2017 and having the title "BROADCAST SCAN NETWORK", the contents of which are incorporated herein by reference in their entirety.

BACKGROUND

Daisy chained Joint Test Action Group (JTAG) registers result in long read/write times, as shifting even a small amount of common test data to multiple registers requires the entire chain to be shifted. Daisy chained JTAG registers result in long test data write cycles even if a small amount of test data needs to be replicated in multiple JTAG registers.

Two simple broadcast network designs have been discussed in the IEEE1687 standard documentation. One of the designs (Fig. E.16 Pg. 232 of the IEEE 1687 Standard document) offers the following scan chain configuration options: a) all the scan segments (JTAG register instances) configured in broadcast mode, or b) all the scan segments configured in daisy mode. Another design (Fig. E.15 Pg. 231 of the IEEE 1687 standard document) offers only the following scan chain configuration options: a) all of the scan segments (JTAG register instances) configured in broadcast mode, or b) exclusive read-out from only one scan segment at any given time.

BRIEF SUMMARY

A new test scan network circuit for use in integrated circuits is disclosed, that supports both broadcast scan mode and daisy scan mode, and also enables the selective bypass any test partition or partition cluster in both modes. The scan network circuit is IEEE 1687 compliant and comprises an improved segment insertion bit lock/unlock feature and option to force reset the shift cells of the SIB. These improvements reduce the amount of time required to switch between broadcast and daisy scan modes over conventional designs. The new scan network also supports the creation of distributed designs for test and test circuit hierarchies.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
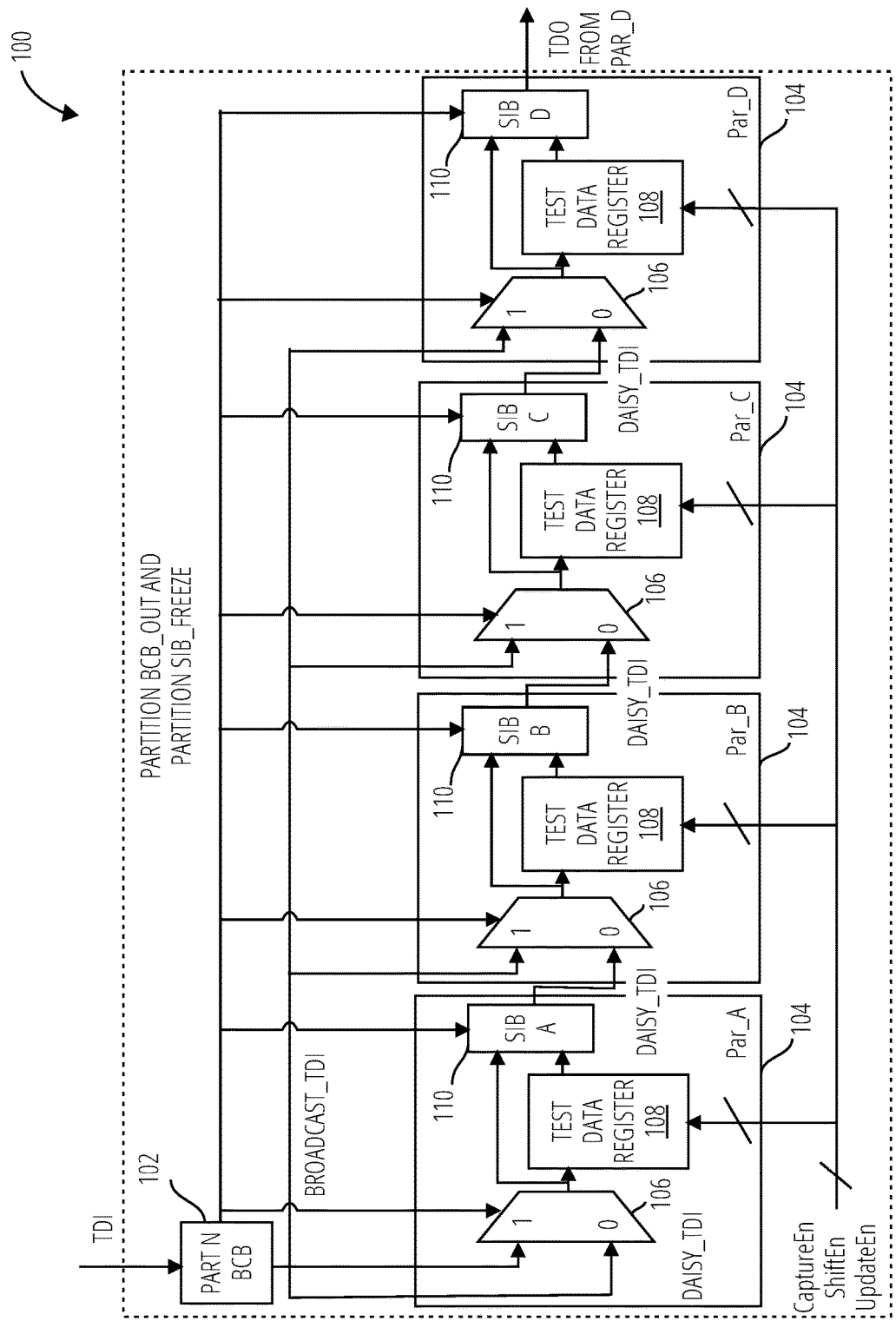
FIG. 1 illustrates a scan network 100 according to one embodiment.

"IEEE 1149" in this context refers to correspondingly numbered IEEE specifications for Test Access Port and Boundary-Scan Architecture, also referred to as daisy-chained JTAG.

"IEEE 1500" in this context refers to IEEE 1500-Standard for Embedded Core Test, a scalable architecture specification for enabling test reuse and integration for embedded cores and associated circuitry. It foregoes addressing analog circuits and focuses on facilitating efficient test of digital aspects of systems on chip (SoCs). IEEE 1500 describes serial and parallel test access mechanisms (TAMs) and a set of instructions suitable for testing cores, SoC interconnect, and circuitry. In addition, IEEE 1500 defines features that enable core isolation and protection.

"IEEE 1687" in this context refers to the IEEE 1687-Standard for Access and Control of Instrumentation Embedded within a Semiconductor Device. A methodology for accessing instrumentation embedded within a semiconductor device, without defining the instruments or their features themselves, via the IEEE 1149.1 test access port (TAP) and/or other signals, is described in this standard. The elements of the methodology include a hardware architecture for the on-chip network connecting the instruments to the chip pins, a hardware description language to describe this network, and a software language and protocol for communicating with the instruments via this network.

"JTAG" in this context refers to a hardware testing and boundary scanning description put forth originally by the Joint Test Action Group. JTAG implements standards for on-chip instrumentation in electronic design automation (EDA) as a complementary tool to digital simulation. It specifies the use of a dedicated debug port implementing a serial communications interface for low-overhead access without requiring direct external access to the system address and data buses. The interface connects to an on-chip test access port (TAP) that implements a stateful protocol to access a set of test registers that present chip logic levels and device capabilities of various parts. IEEE Standard 1149.1-1990 provides a specification for implementing JTAG in integrated circuits.

"Wrapper" in this context refers to logic at the boundary of a functional unit (i.e., logic block implementing a defined function) within an integrated circuit. The wrapper enables different test circuits to interface with the functional unit. Use of wrappers enables modular or partition-based debug, diagnosis and testing of the functional units.

Signal and register names and conventions used herein, unless otherwise indicated, refer to the like-named signals and registers referred to in the IEEE 1500 standard.

An efficient broadcast scan network design when combined with a conventional daisy scan network can help in improving the test times. An efficient broadcast scan network design can improve the total test time by reducing the time required to write common data to multiple JTAG registers. A network in which the JTAG registers can be used in both the daisy and broadcast (parallel) modes along with an option to selectively bypass any JTAG register in both the modes, provides flexibility during read/write operations and reduces overall test time.

The new test scan circuit(s) disclosed herein utilizes aspects of the IEEE 1687 standard. The new broadcast scan circuit is implemented as an IEEE 1500 based JTAG network for distributed DFT (design for test). However, it can be used in any test network that supports the IEEE 1687 standard. Compared to a simple JTAG network that is built based on chip level configurations (e.g., custom purpose), a distributed DFT architecture (built based on chiplet/partition level configurations) implemented using an IEEE 1500 based JTAG network offers improvements such as reduced top-level routing and congestion, easy test logic insertion, hierarchical test network capability, and reusable test logic for different IP module instantiations. The distributed DFT architecture described herein also improves the test flow by reducing the burden on verification and timing closure effort for each new IP module instantiation.

The new distributed DFT circuit has multiple IEEE 1500 clusters. Each of these clusters are associated with a functional unit such as a chiplet, sub-chiplet, padlet, a user specified unit, or an IP module. Along with the required JTAG registers for the IEEE 1500 compliance, a cluster may also include auto-generated registers instantiated within IEEE 1500 client logic. The IEEE 1500 clients within the clusters, and the clusters within the chip, are daisy chained.

The new scan network circuit therefor supports both broadcast scan mode and daisy scan mode, and also allows the selective bypass of any test data register (TDR) or JTAG register in the scan chain, for both modes.

Further disclosed is a new IEEE 1687 compliant segment insertion bit (SIB) circuit that features an improved SIB lock/unlock feature (pipelined UpdateEn to the Update cell), and an option to force a reset of the shift cells of the SIB. These design improvements reduce the amount of time required to switch between broadcast and daisy scan modes.

The new circuit enables selective test data broadcast to some clients/clusters, while bypass the remaining clients/clusters, during broadcast mode. Exiting from broadcast mode to daisy mode results in a deterministic daisy chain configuration. The daisy chain configuration on exiting the broadcast mode does not depend on the prior broadcast mode configuration or the shifted data during the last broadcast scan operation. Conventional solutions do not offer this feature. In the existing solutions, the daisy chain configuration after exiting broadcast mode depends on the broadcast mode configuration or the shifted data during the last broadcast scan operation.

The deterministic daisy chain circuit configuration is of minimal possible scan length upon exiting the broadcast mode. This reduces the amount of time required to reconfigure the scan path for the next daisy mode operation that follows the previous broadcast mode operation.

The new scan network circuit enables hierarchical test circuit designs, while maintaining the above-mentioned feature set. Thus, scan network circuits may be implemented for JTAG registers at partition level within a cluster in a chip, and on the chip level among different clusters.

FIG. 1 illustrates a scan network 100 according to one embodiment. The scan network 100 comprises a partition broadcast control bit 102, partitions 104, a partition scan mux 106, a partition test data register 108, and partition segment insertion bits 110.

The scan network 100 is based on the IEEE 1687 standard. The scan network 100 can operate in both the broadcast mode and daisy mode. The partition broadcast control bit 102 generates the broadcast control (BCB_Out) signal shown in FIG. 1. BCB_Out is used as the select signal for each partition scan mux 106, feeding each partition test data register 108 with the broadcast test data input, BROADCAST_TDI. The scan network 100 operates in broadcast mode when the BCB_Out signal is asserted, and switches to daisy mode when BCB_Out is de-asserted. During the broadcast mode, the test data BROADCAST_TDI is simultaneously applied to all the partition test data register 108 in parallel, and the Test Data Out (TDO) carries the scan out data from the last partition (Par_D).

DAISY_TDI refers to test data daisy chained to a subsequent partition in the scan network 100 from an immediately prior partition.

The partition test data register 108 in each partition can be bypassed or added to the active scan path using the partition segment insertion bits 110 (SIB). The SIB design enables correct and intended operation of the scan network 100 in broadcast mode, and also reduces the amount of time required to reconfigure the scan network 100 after switching from broadcast mode to daisy mode.

Figure 2:
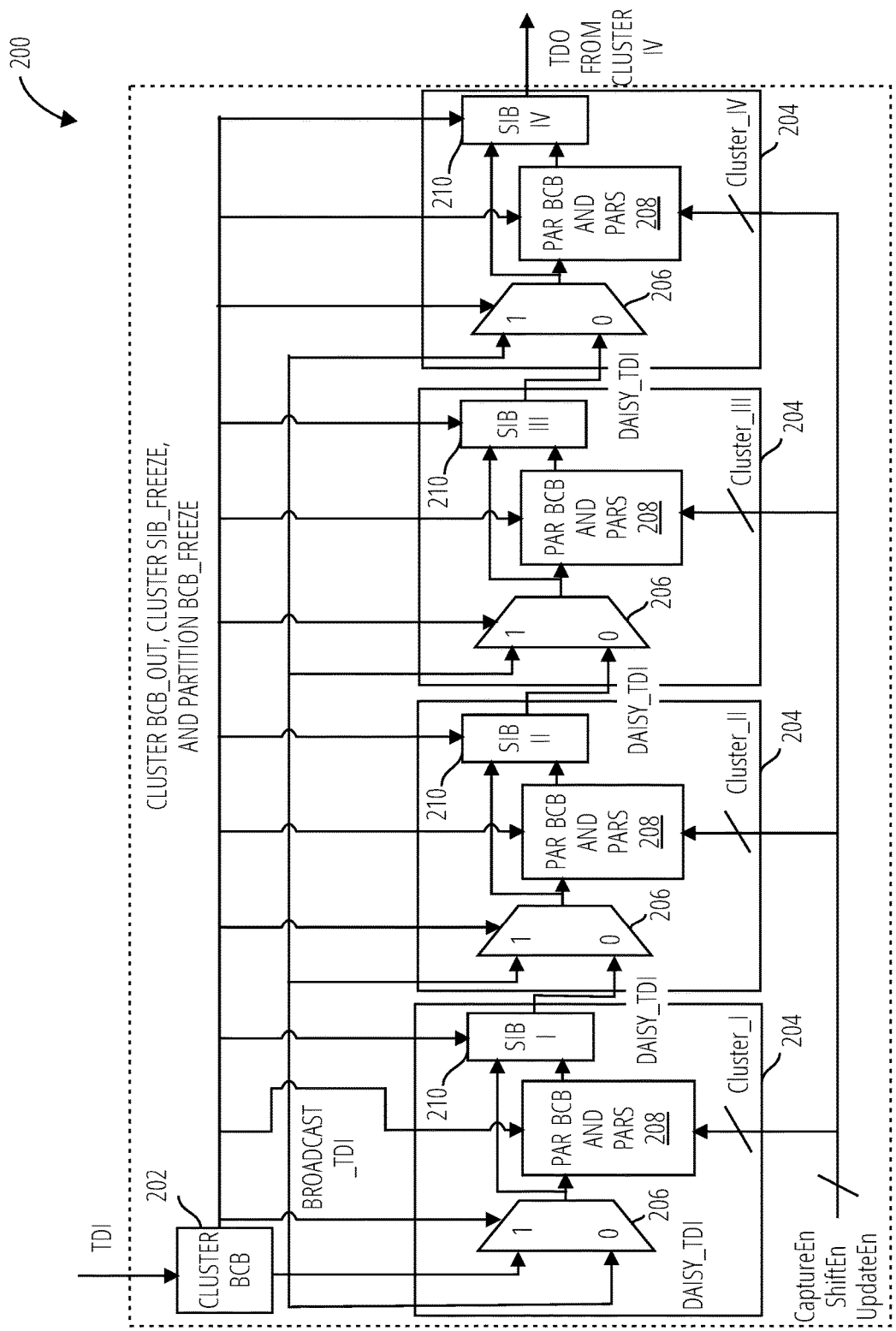
FIG. 2 illustrates a cluster network 200 according to one embodiment.

FIG. 2 illustrates a cluster network 200 according to one embodiment. The cluster network 200 comprises a cluster broadcast control bit 202, clusters 204, a cluster scan mux 206, partitions 208, and cluster segment insertion bits 210.

The scan network 100 introduced earlier also supports network hierarchy. The different partitions 104 shown in FIG. 1 can be grouped as clusters 204 as shown in FIG. 2. In FIG. 2, the scan network uses the cluster broadcast control bit 202 to support chip level broadcast and daisy modes among the clusters 204. Each of the clusters 204 includes a cluster scan mux 206, partitions 208, and cluster segment insertion bits 210. Thus, the partition broadcast control bit 102 and cluster broadcast control bit 202 may be used cooperatively to create a test hierarchy circuit.

Within each of the clusters 204 there may be a cluster level broadcast and daisy mode (by operating each of the cluster scan mux 206) among the partitions as shown in FIG. 1. Each of the clusters 204 can be bypassed or added to the active scan path using the cluster SIBs (cluster segment insertion bits 210) which operate similar to the partition segment insertion bits 110 of each scan network 100 within the clusters, but at a partition cluster level rather than at the partition level.

During the chip level broadcast write operations, the cluster segment insertion bits 210 within each of the clusters 204 are locked. Thus, the cluster segment insertion bits 210 do not change their values during chip level broadcast writes.

Figure 3:
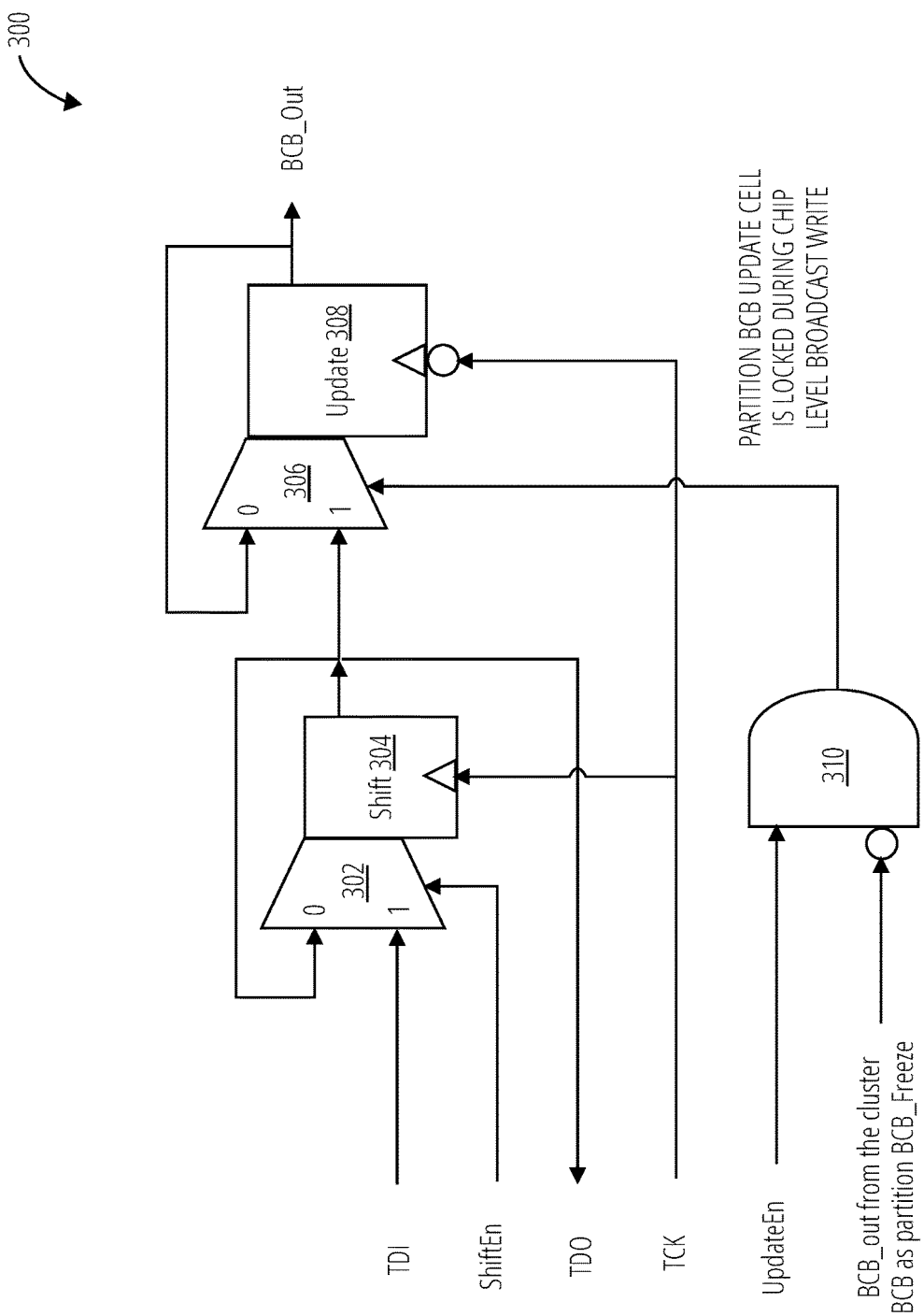
FIG. 3 illustrates a conventional broadcast control bit circuit 300.

FIG. 3 illustrates a conventional broadcast control bit circuit 300. The broadcast control bit circuit 300 comprises a multiplexer 302 providing inputs to a shift cell 304, a multiplexer 306 providing inputs to an update cell 308, and a gate 310.

The broadcast control bit circuit 300 of FIG. 3 implements the ScanRegister module described in the IEEE1687 standard, and it controls (operates the selection signal of) the partition scan mux 106 shown in FIG. 1. In a hierarchical network, the BCB_Out signal from the cluster broadcast control bit 202 is used to lock the partition broadcast control bit 102, in a similar fashion but at the cluster level.

Figure 4:
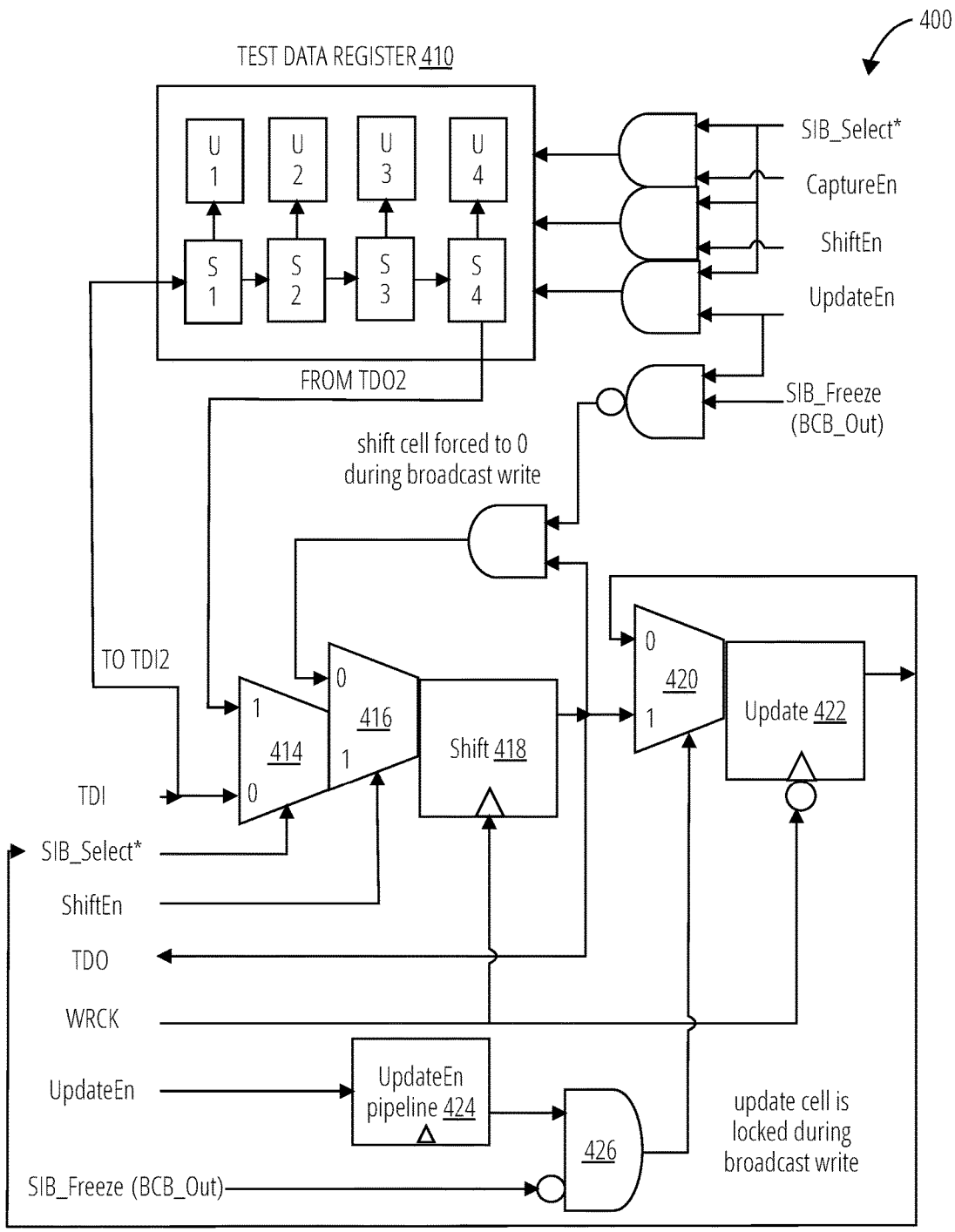
FIG. 4 illustrates a segment insertion bit circuit 400 in accordance with one embodiment.

FIG. 4 illustrates an improved segment insertion bit circuit 400 in accordance with one embodiment. The segment insertion bit circuit 400 operates on a Test Data Register 410. In this embodiment, the segment insertion bit circuit 400 comprises a multiplexer 414 and a multiplexer 416 providing inputs to a shift cell 418, a multiplexer 420 providing inputs to an update cell 422, and further comprises an update pipeline 424 and a gate 426 providing inputs to control the multiplexer 420.

TABLE 1

SIB states

| SIB State | Update Cell | SIB Freeze (or BCB_Out) | TDR | Scan Mode |
|---|---|---|---|---|
| Open and unfrozen | 1 | 0 | Active | Daisy |
| Closed and unfrozen | 0 | 0 | Bypass | Daisy Bypass |
| Open and Frozen | 1 | 1 | Active | Broadcast |
| Closed and Frozen | 0 | 1 | Bypass | Broadcast Bypass |

The improved segment insertion bit circuit 400 shown in FIG. 4 is designed to support the features of the new scan network 100. The segment insertion bit circuit 400 can be in the states shown in Table 1, based on the SIB_Freeze (BCB_Out) signal and the value stored in the update cell 422.

When the segment insertion bit circuit 400 is set to "open", it places the partition in non-bypass mode, and adds the Test Data Register 410 to the active scan path. The segment insertion bit circuit 400 can be opened by shifting a 1 (for example) into its shift cell 418 and then performing an UpdateEn. The UpdateEn signal feeds the gate 426 and the output from the gate 426 operates the select input of the multiplexer 420 supplying the update cell 422.

The update cell 422 asserts the SIB_Select signal which causes the multiplexer 414 to select the input connected to the TDO2 signal, which is then fed to the shift cell 418 via the multiplexer 416.

When closed, the segment insertion bit circuit 400 acts as a one-bit bypass register. The segment insertion bit circuit 400 is closed by shifting a value 0 in the shift cell 418 (for example), followed by performing an UpdateEn. This de-asserts the SIB_Select signal.

The BCB_Out signal is asserted to the gate 426 during broadcast mode. With reference to the SIB, the BCB_Out signal is referred to as SIB_Freeze in FIG. 4.

The SIB_Freeze signal, when asserted, prevents the UpdateEn signal from being applied to the update cell 422. Thus, the segment insertion bit circuit 400 does not change its open or close state (SIB_Select signal) during broadcast write mode, even if a different value is shifted into the shift cell 418 during broadcast shift. The scan network 100 is improved by pipelining (e.g., using update pipeline 424) the UpdateEn signal to the update cell 422 to eliminate an additional shift sequence that would be required to reconfigure the segment insertion bit circuit 400 after a broadcast operation.

Utilizing the update pipeline 424 to pipeline UpdateEn to the update cell 422 enables an end of the broadcast write mode (thus unlocking all the partition segment insertion bits 110) and updating all of the unlocked SIBs using the same JTAG UpdateDR cycle.

Figure 5:
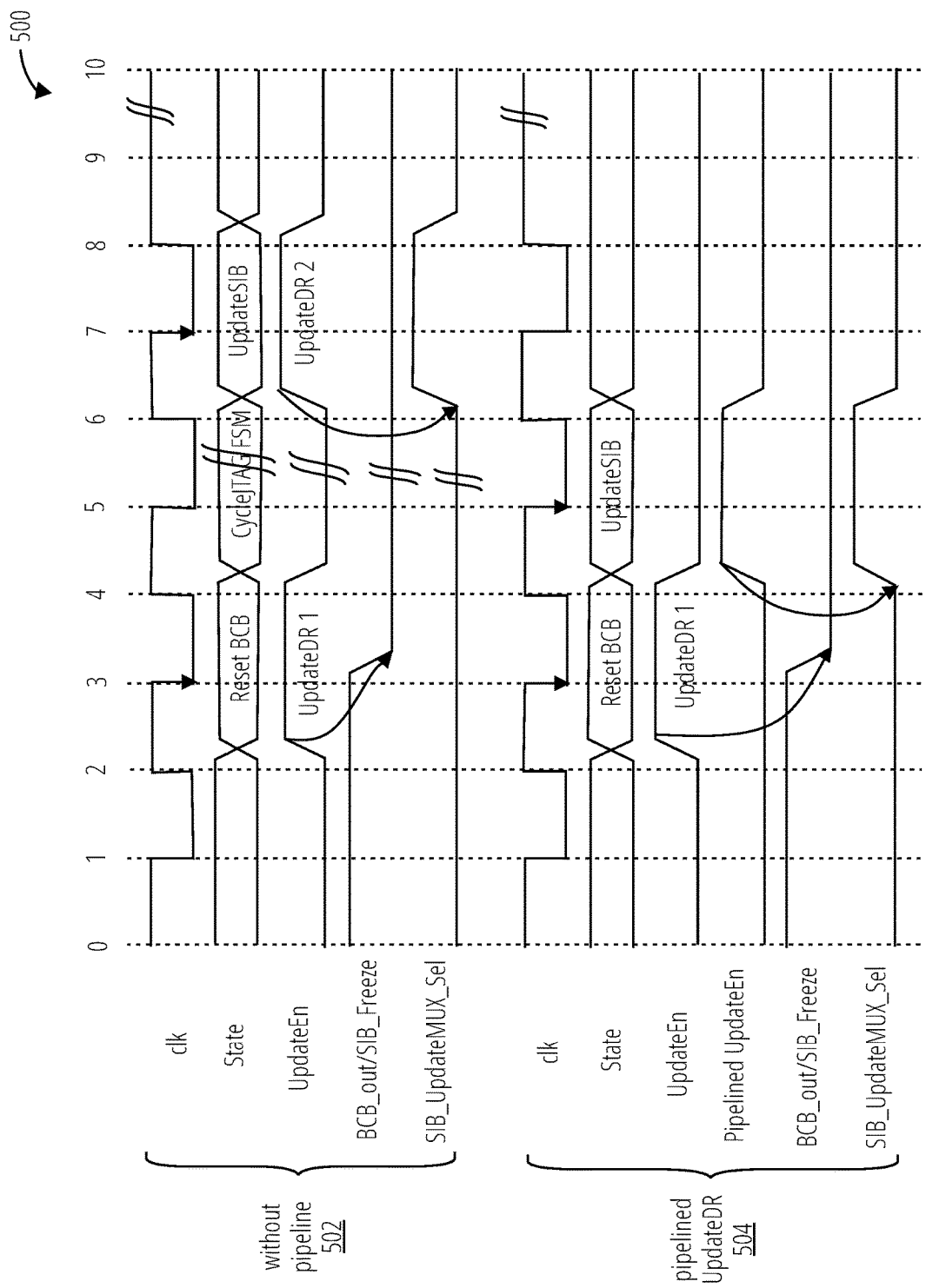
FIG. 5 illustrates a timing diagram for SIB 500 in accordance with one embodiment.

FIG. 5 illustrates a timing diagram for SIB 500 for the segment insertion bit circuit 400 in accordance with one embodiment. The timing diagram for SIB 500 includes timing for a SIB without pipeline 502, and timing for a SIB with pipelined UpdateDR 504.

FIG. 5 shows the timing diagram for generating the select input of the multiplexer 420 in the segment insertion bit circuit 400 (labelled as SIB_UpdateMux_Sel). The BCB that generates the BCB_Out (or SIB_Freeze) signal is set to a zero (0) to exit the broadcast write mode. The exit is complete once the BCB receives an UpdateEn signal. This deasserts the BCB_Out (or SIB_Freeze) signal, thus unlocking each partition broadcast control bit 102 and allowing the next UpdateEn signal to propagate to the SIB_UpdateMux_Sel input.

With pipelined UpdateEn, the same UpdateEn signal that updated the BCB to its reset value, arrives at the segment insertion bit circuit 400 lock gate (e.g., gate 426) with a delay of one clock cycle. By this time, the SIB_Freeze signal has already been de-asserted due to the BCB reset operation in the previous cycle.

On exiting the broadcast mode, the network switches to daisy mode. Thus, any scan path reconfiguration involves shifting through the daisy scan chain. If all the SIBs at this time are in the closed (all TDRs are bypassed) state, then reconfiguring the scan chain requires a smaller scan pattern of size equal to the number of SIBs in the network. Thus, when exiting broadcast write mode, the shift cells of the SIBs should contain a zero. After the SIB_Freeze signal is de-asserted (as a result of broadcast mode exit), the UpdateEn will arrive at the Update cell of the SIBs and all the SIBs will close. Thus, the resulting daisy scan chain length after a broadcast scan does not depend on the last broadcast scan configuration. This is achieved by overriding the feedback signal to the Shift cell with a zero during UpdateDR (UpdateEn=1) when the SIB_Freeze is on.

Thus, by the time the pipelined UpdateEn signal arrives at the SIB, the SIB is in the following state:

i. The segment insertion bit circuit 400 shift cell 418 contains value zero (as described previously).

ii. The SIB_Freeze signal is de-asserted, unlocking the segment insertion bit circuit 400 update cell 422.

Figure 6:
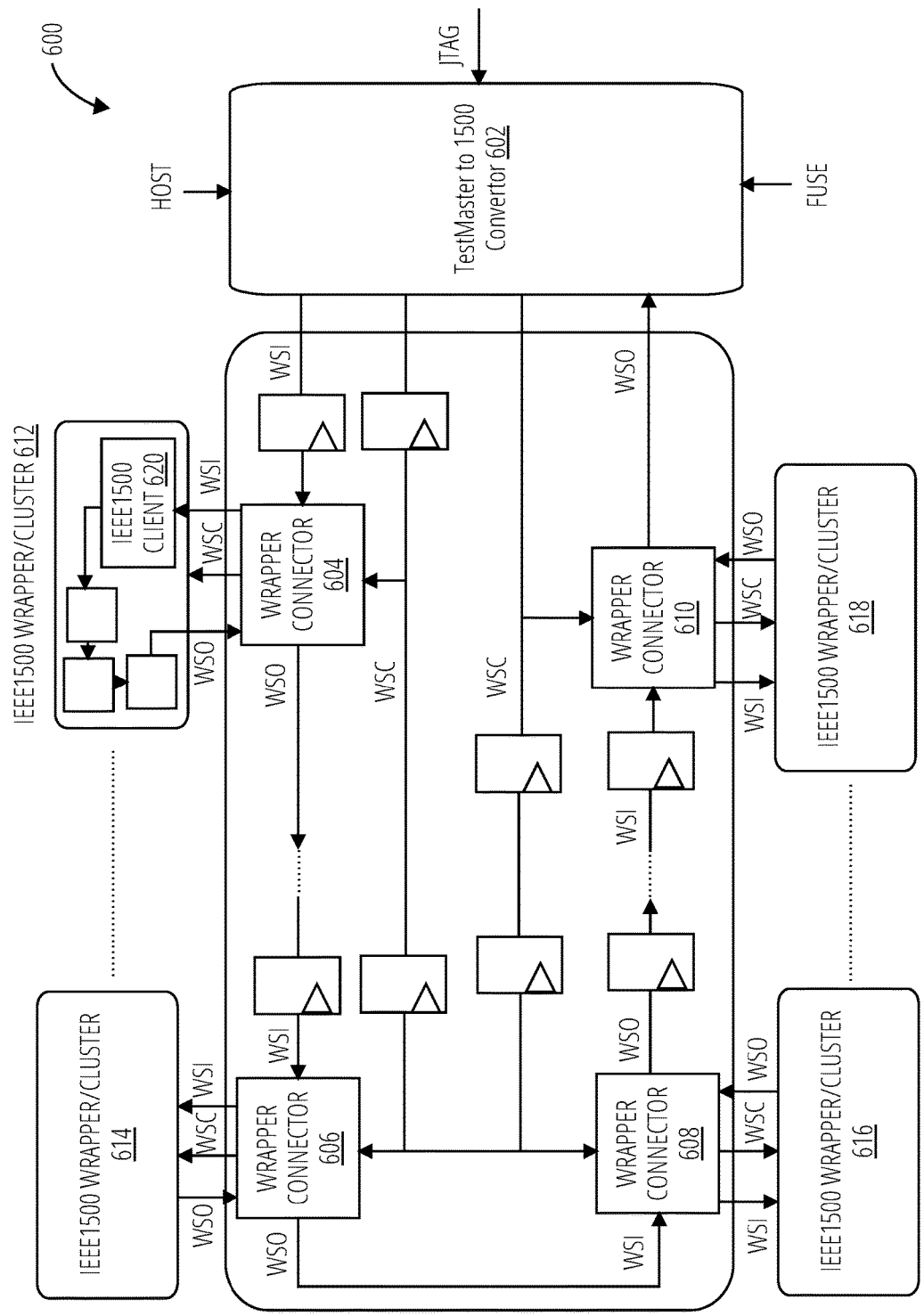
FIG. 6 illustrates a distributed DFT 600 in accordance with one embodiment.

FIG. 6 illustrates a distributed DFT 600 in accordance with one embodiment. The distributed DFT 600 comprises a TestMaster to 1500 Convertor 602, various wrapper connectors, and various wrapper clusters. Each wrapper cluster will typically comprise at least one IEEE1500 client 620 (typically more than one) organized in a chain.

The distributed DFT 600 implements the IEEE1500 test protocol. In FIG. 6 and other drawings, WSI is the serial test data input to the wrappers, WSO is the serial data output from the wrappers, and WSC refers to serial control signals. All the IEEE1500 clusters (e.g., IEEE1500 Wrapper/Cluster 612, IEEE1500 Wrapper/Cluster 614, IEEE1500 Wrapper/Cluster 616 . . . IEEE1500 Wrapper/Cluster 618) are daisy chained using the wrapper connectors (e.g., wrapper connector 604, wrapper connector 606, wrapper connector 608 . . . wrapper connector 610), and the IEEE1500 clients (e.g., IEEE1500 client 620) (partition) within these clusters are daisy chained as well. Each cluster is associated with a functional unit (logic block) of the chip to test. The wrapper connectors comprise IEEE1500 compliant modules (e.g., wrapper bypass registers WBY, or wrapper instruction registers WIR) that can be used to bypass the corresponding cluster connected to a particular wrapper connector. Each wrapper connector interfaces with the TestMaster to 1500 Convertor 602. The 1500 convertor is a submodule of TestMaster, a component which accepts EEEE 1149 compliant JTAG signals. The 1500 convertor converts these signals from IEEE 1149 protocol to IEEE 1500 protocol. The output from TestMaster and all downstream modules operate on 1500 protocol signals.

The designs of the IEEE1500 clients (partition level), wrapper connectors, client network (cluster level), and cluster network (chip level) shown in FIG. 6 are modified to comprise the improved IEEE1687 scan network (e.g., scan network 100). This enables the distributed DFT 600 with efficient broadcast and daisy scan modes as described previously. The modifications comprised by the distributed DFT 600 should not increase/decrease the JTAG register lengths compared to conventional approaches.

Figure 7:
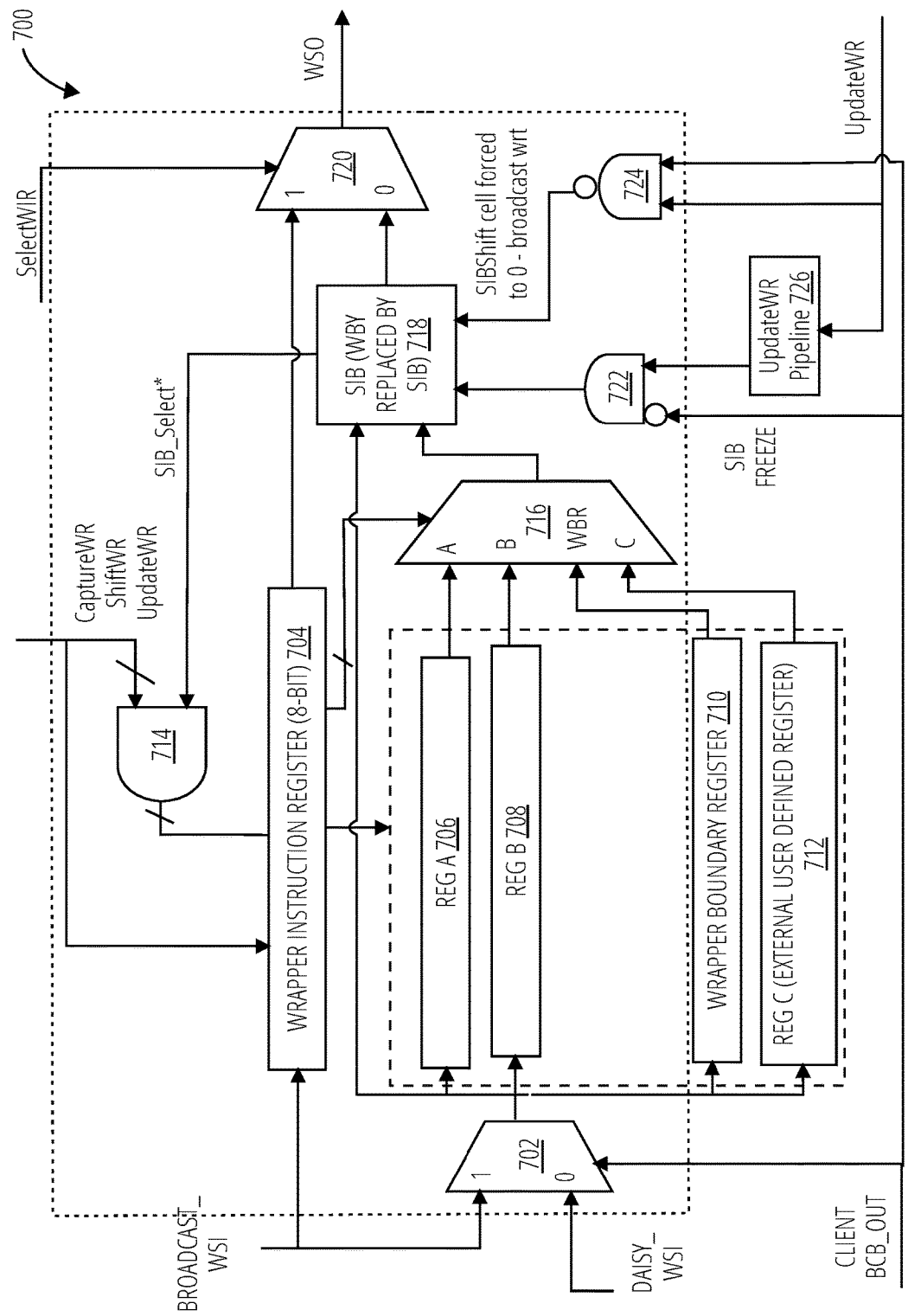
FIG. 7 illustrates a modified IEEE1500 client 700 in accordance with one embodiment.

FIG. 7 illustrates a modified IEEE1500 client 700 (e.g., IEEE1500 client 620) in accordance with one embodiment. The modified IEEE1500 client 700 comprises a multiplexer 702, a wrapper instruction register 704, a register 706, a register 708, a wrapper boundary register 710, a register 712, a gate 714, a multiplexer 716, a segment insertion bit 718, a multiplexer 720, a gate 722, a gate 724, and an updateWR pipeline 726.

At the partition level, the modified IEEE1500 client 700 includes the segment insertion bit circuit 400 design shown in FIG. 4. The IEEE1500 compliant wrapper bypass (WBY) register has been replaced with the improved segment insertion bit 718. The segment insertion bit 718 adds only the shift cell 418 in the active scan path, thus the scan length does not change. The new segment insertion bit 718 can be accessed during each data register shift because the segment insertion bit 718 is always in the data path of the client. These clients can now be used in a network such as scan network 100.

Figure 8:
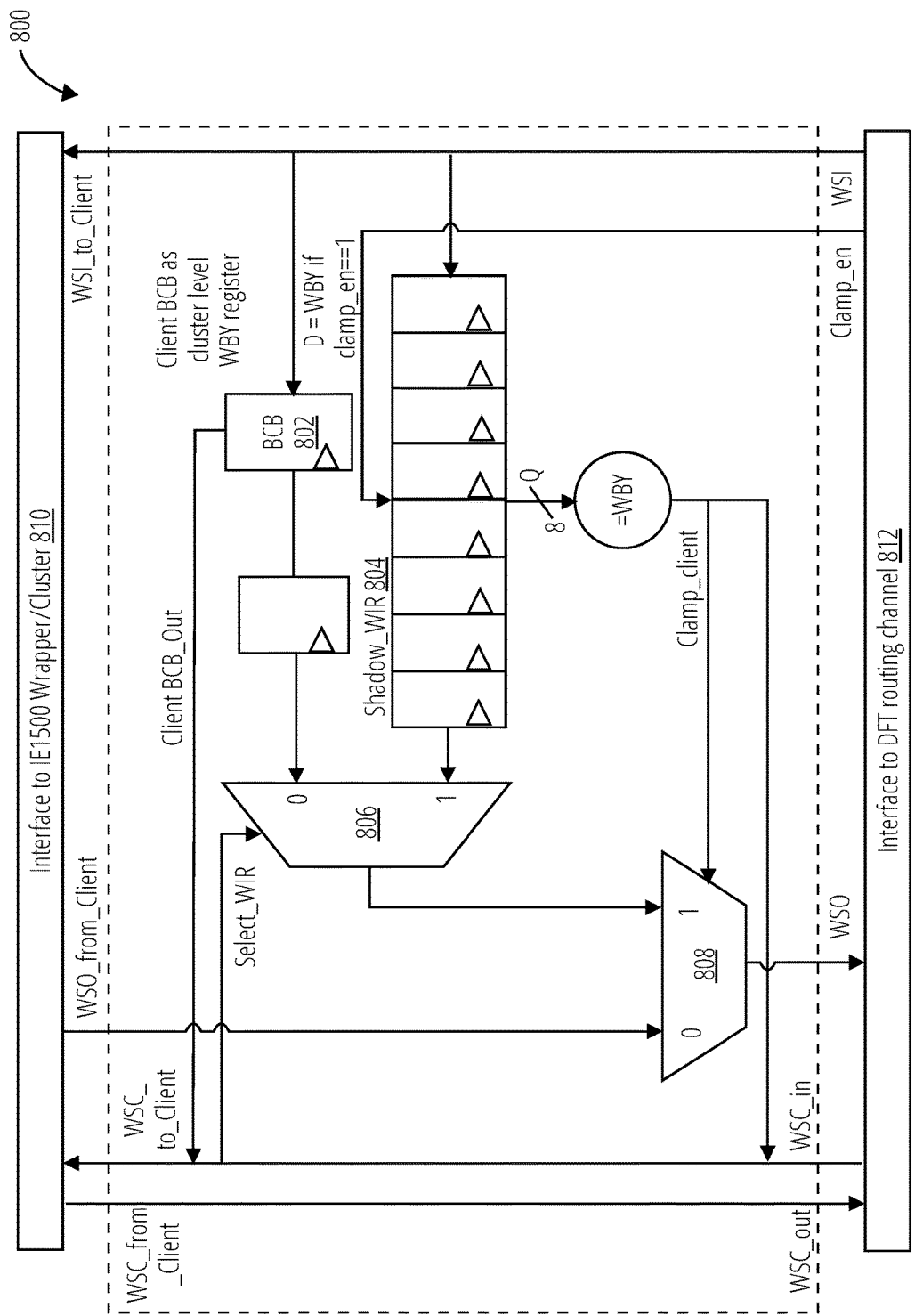
FIG. 8 illustrates a cluster wrapper connector 800 in accordance with one embodiment.

FIG. 8 illustrates a cluster wrapper connector 800 in accordance with one embodiment. The cluster wrapper connector 800 comprises a broadcast control bit 802, a Shadow_WIR 804, a multiplexer 806, a multiplexer 808, an interface 810, and an interface 812. As previously noted, WIR refers to a wrapper instruction register, and WBY refers to a wrapper bypass register.

Each IEEE1500 cluster has a corresponding cluster wrapper connector. The cluster wrapper connector 800 is modified to replace the bypass register (WBY) in the conventional wrapper connector with the BCB (e.g., broadcast control bit 802). The broadcast control bit 802 is used to generate BCB_Out signal for the IEEE1500 clients in the cluster. The broadcast control bit 802 value can be only modified by putting the cluster wrapper connector 800 in WBY mode by shifting WS_BYPASS instruction in the Shadow_WIR 804.

Figure 9:
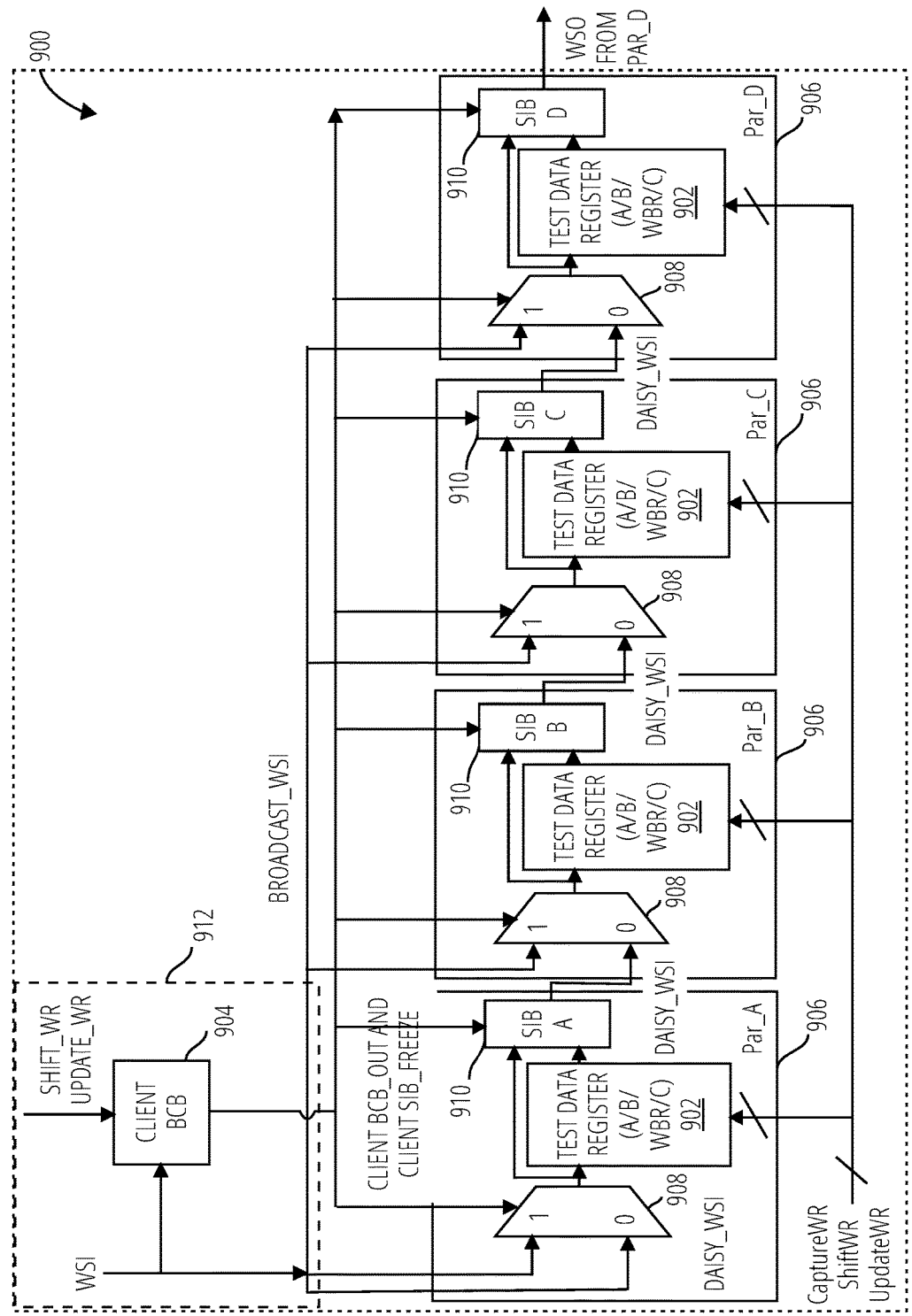
FIG. 9 illustrates a scan network 900 according to one embodiment.

FIG. 9 illustrates a scan network 900 according to one embodiment. The scan network 900 comprises a partition test data register 902, a client broadcast control bit 904, a partitions 906, a partition scan mux 908, a partition segment insertion bits 910, and a wrapper connector 912.

The scan network 900 in FIG. 9 is similar to the scan network 100 shown in FIG. 1. At cluster level, the scan network 900 can operate in both the broadcast and daisy modes on the clients in the cluster. The cluster's wrapper connector comprises the BCB for the clients (e.g., client broadcast control bit 904). Each partition test data register 902 comprises the JTAG registers from the IEEE1500 clients. Instruction Registers (IRs) of all the clients within a cluster are always in broadcast mode. Because of this, all the clients within a cluster select the same JTAG register for the active scan path.

Figure 10:
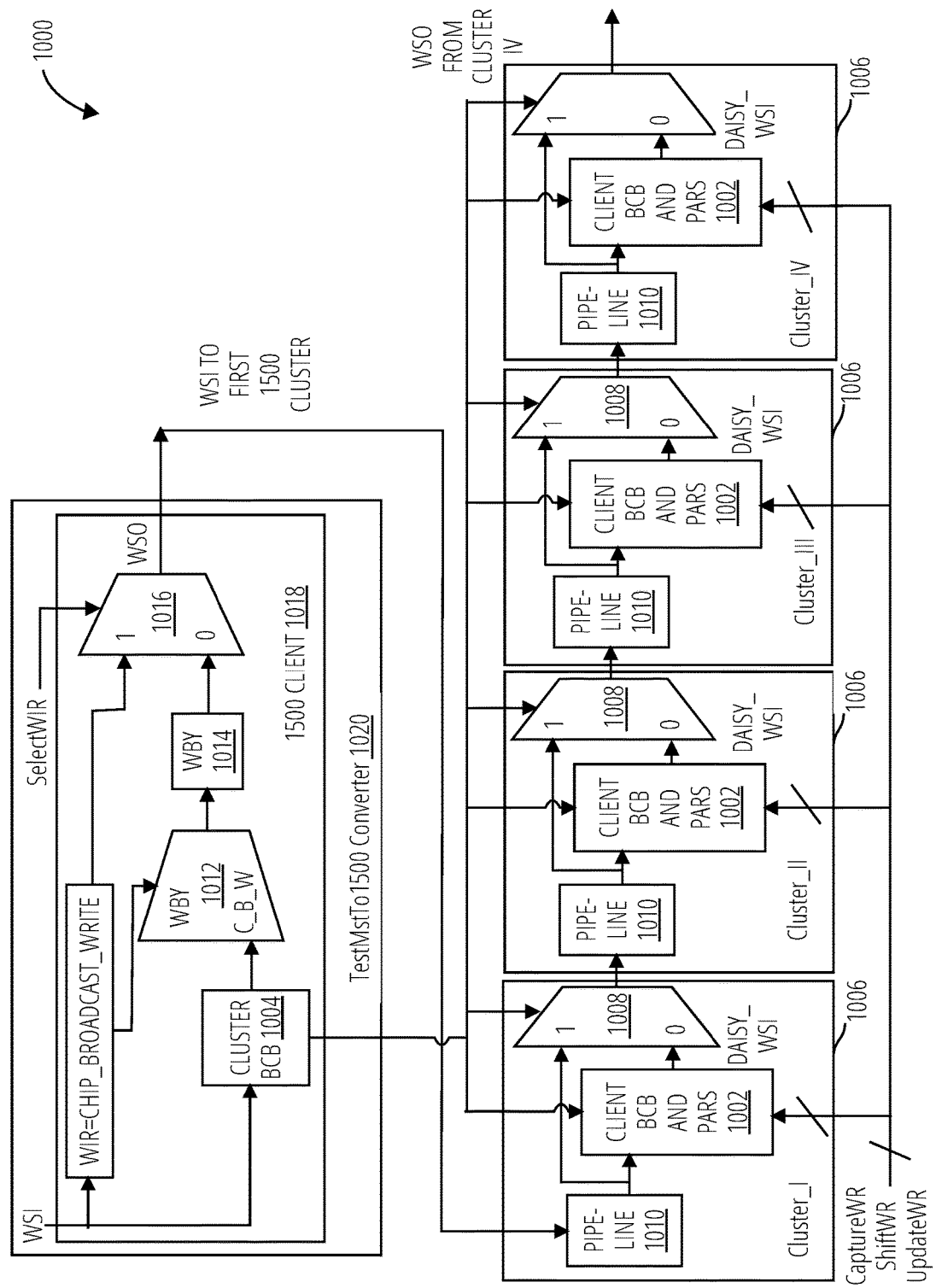
FIG. 10 illustrates a cluster network 1000 according to one embodiment.

FIG. 10 illustrates a cluster network 1000 according to one embodiment. The cluster network 1000 comprises a client broadcast control bit 1002, a cluster broadcast control bit 1004, clusters 1006, a cluster scan multiplexer 1008, a pipeline 1010, a multiplexer 1012, a WBY 1014, a multiplexer 1016, a 1500 client 1018, and a converter 1020.

TABLE 2

Hierarchical scan network modules.

| Hierarchy Level | Includes | TDR | Bypass Control | Broadcast Control |
|---|---|---|---|---|
| Partition | IEEE 1500 client with client SIBs | Partition TDR | Partition SIB | — |
| Cluster | Client BCB in wrapper connector and client network | All the partition TDRs | Shadow WIR in wrapper connector = WS_BYPASS | Client BCB |
| Chip | Cluster BCB and cluster network | All the clusters | — | Cluster BCB |

Table 2 above summarizes the hierarchical modules of the IEEE1500 network with the IEEE1687 based broadcast scan design.

The cluster network 1000 shown in FIG. 10 is slightly different than the hierarchical cluster network 200 shown in FIG. 2. The cluster network 1000 does not use SIBs for the clusters 1006 because each cluster has its own wrapper connector that can be used to bypass the cluster. The instruction registers of all the wrapper connectors are daisy chained. Thus, different instructions can be shifted for different clusters.

The chip level cluster BCB controls the broadcast mode for all the clusters. The cluster BCB can be accessed as a JTAG register in the top level IEEE1500 client of the chip, using the CHIP_BROADCAST_WRITE command.

The cluster BCB is operable to lock the client BCBs during chip level broadcast.

When a cluster is in bypass mode, it allows access to the cluster level client BCB in the wrapper connector. Thus, the client BCB within bypassed clusters may get updated when chip level broadcast write operations are performed on the other non-bypassed clusters. Because these client BCBs belong to bypassed clusters, it will not affect the actual test data.

However, in certain test scenarios this can lead to more test time while switching from one group of broadcasted clusters to another group of clusters that needs to be broadcast. For example, assume that the clusters I and II were bypassed during the previous chip level broadcast write operation on other clusters. In the previous chip level broadcast, the client BCBs of clusters I and II may change their value. This could switch the clusters I and II from broadcast bypass mode to daisy bypass mode. Now, if the clusters I and II are used in the next broadcast operation, then it would be necessary to reconfigure their client BCBs, to put the clusters I and II in broadcast mode again.

To avoid this penalty, the client BCBs can be locked (similar to the locks for the SIBs discussed earlier) so that the client BCBs of bypassed clusters do not get updated with new values during chip level broadcast. The cluster broadcast ctrl signal from the chip level parent cluster BCB can be used to lock all the cluster level client BCBs.

Interpretation and Terminology

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

Various logic functional operations described herein may be implemented in logic that is referred to using a noun or noun phrase reflecting said operation or function. For example, a compare or comparison may be carried out by a "comparator", and so on.

"Circuitry" in this context refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Comparator" in this context refers to a logic element that compares two or more inputs to produce one or more outputs that reflects similarity or difference of the inputs. An example of a hardware comparator is an operational amplifier that outputs a signal indicating whether one input is greater, less than, or about equal to the other. An example software or firmware comparator is: if (input1==input2) output=val1; else if (input1>input2) output=val2; else output=val3; Many other examples of comparators will be evident to those of skill in the art, without undo experimentation.

"Firmware" in this context refers to software logic embodied as processor-executable instructions stored in read-only memories or media.

"Hardware" in this context refers to logic embodied as analog or digital circuitry.

"Logic" in this context refers to machine memory circuits, non-transitory machine readable media, and/or circuitry which by way of its material and/or material-energy configuration comprises control and/or procedural signals, and/ or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Software" in this context refers to logic implemented as processor-executable instructions in a machine memory (e.g. read/write volatile or nonvolatile memory or media).

What is claimed is:

1. A distributed test circuit, comprising:
a plurality of circuit partitions arranged in series to form a scan path;
each of the circuit partitions comprising a scan multiplexer, a test data register, and a segment insertion bit circuit;
the scan multiplexer of each of the circuit partitions providing inputs to a corresponding test data register of each of the circuit partitions;
control logic to generate a broadcast mode select signal to the scan multiplexer of each of the circuit partitions to place the test circuit in a broadcast mode when the broadcast mode select signal is asserted, and to switch the test circuit to a daisy mode when the broadcast mode select signal is de-asserted; and
each segment insertion bit circuit operable to include or bypass the corresponding circuit partition from the scan path.

2. The distributed test circuit of claim 1, further comprising:
the test circuit configured in the broadcast mode to apply test data for each of the circuit partitions simultaneously to each corresponding test data register; and
the test circuit configured in the daisy mode to shift the test data sequentially along the series arrangement of circuit partitions.

3. The distributed test circuit of claim 1, each segment insertion bit circuit comprising:
a shift cell coupled to receive test data from the test data register;
an update cell coupled to receive the test data from the shift cell;
an update pipeline coupled to provide a shift signal to the shift cell; and
a control circuit coupled to freeze operation of the shift cell during the broadcast mode.

4. The distributed test circuit of claim 3, the control circuit comprising a gate receiving the broadcast mode select signal and an output of the update pipeline, the gate coupled to select a test data input to the update cell.

5. The distributed test circuit of claim 3, each segment insertion bit circuit having operational states given by the following table:

| SIB State | Update Cell | Broadcast Mode Select Signal | Test Data Register | Test Circuit Mode |
|---|---|---|---|---|
| Open and unfrozen | 1 | 0 | Active | Daisy |
| Closed and unfrozen | 0 | 0 | Bypass | Daisy Bypass |
| Open and Frozen | 1 | 1 | Active | Broadcast |
| Closed and Frozen | 0 | 1 | Bypass | Broadcast Bypass. |

6. A distributed test circuit, comprising:
a plurality of circuit clusters arranged in series to form a scan path;
each of the circuit clusters comprising a scan multiplexer, and a segment insertion bit circuit, and a series arrangement of circuit partitions;
each circuit partition of each of the circuit clusters comprising a test data register;
the scan multiplexer of each of the circuit clusters providing inputs to a first circuit partition of the series arrangement of circuit partitions in the corresponding circuit cluster;

control logic to place the test circuit in a broadcast mode when a broadcast select signal is asserted, and to switch the test circuit to a daisy mode when the broadcast select signal is de-asserted; and each segment insertion bit circuit operable to include or bypass the corresponding circuit cluster from the scan path.

7. The distributed test circuit of claim 6, further comprising:

the test circuit configured in the broadcast mode to apply test data for each of the circuit partitions simultaneously to each corresponding test data register; and the test circuit configured in the daisy mode to shift the test data sequentially along the series arrangement of circuit partitions.

8. The distributed test circuit of claim 6, wherein each circuit partition comprises:

a partition-level scan multiplexer, the test data register, and a partition-level segment insertion bit circuit, the partition-level scan multiplexer providing inputs to the test data register.

9. The distributed test circuit of claim 8, wherein each of the series arrangement of circuit partitions of each of the circuit clusters further comprises:

partition-level control logic to generate a partition-level broadcast select signal to the partition-level scan multiplexer of each of the circuit partitions in the series arrangement of circuit partitions, to place each circuit partition of the series arrangement of circuit partitions in the broadcast mode when the partition-level broadcast select signal is asserted, and to switch each circuit partition of the series arrangement of circuit partitions to the daisy mode when the partition-level broadcast select signal is de-asserted; and the partition-level segment insertion bit circuit operable to include or bypass the corresponding circuit partition of the series arrangement of circuit partitions from the scan path.

10. The distributed test circuit of claim 8, each partition-level segment insertion bit circuit comprising:

a shift cell coupled to receive test data from the test data register;

an update cell coupled to receive the test data from the shift cell;

an update pipeline coupled to provide a shift signal to the shift cell; and a control circuit coupled to freeze operation of the shift cell during the broadcast mode.

11. The distributed test circuit of claim 10, the control circuit comprising a gate receiving the broadcast mode select signal and an output of the update pipeline, the gate coupled to select a test data input to the update cell.

12. The distributed test circuit of claim 10, each partition-level segment insertion bit circuit having operational states given by the following table:

| SIB State | Update Cell | Broadcast Mode Select Signal | Test Data Register | Test Circuit Mode |
|---|---|---|---|---|
| Open and unfrozen | 1 | 0 | Active | Daisy |
| Closed and unfrozen | 0 | 0 | Bypass | Daisy Bypass |
| Open and Frozen | 1 | 1 | Active | Broadcast |
| Closed and Frozen | 0 | 1 | Bypass | Broadcast Bypass. |

* * * * *

UNITED STATES PATENT AND TRADEMARK OFFICE
CERTIFICATE OF CORRECTION

| | | |
|---|---|---|
| PATENT NO. | : 10,436,840 B2 | Page 1 of 1 |
| APPLICATION NO. | : 15/935438 | |
| DATED | : October 8, 2019 | |
| INVENTOR(S) | : Jue Wu and Saurabh Gupta | |

It is certified that error appears in the above-identified patent and that said Letters Patent is hereby corrected as shown below:

On the Title Page

Item [72], delete "Jau Wu" and insert --Jue Wu--.

Signed and Sealed this
Twenty-second Day of April, 2025

Coke Morgan Stewart
*Acting Director of the United States Patent and Trademark Office*